(12) United States Patent
Wang et al.

(10) Patent No.: US 11,083,095 B2
(45) Date of Patent: Aug. 3, 2021

(54) FLEXIBLE DISPLAY DEVICE

(71) Applicant: Yungu (Gu'an) Technology Co., Ltd., Langfang (CN)

(72) Inventors: Gang Wang, Langfang (CN); Ronghui Qian, Langfang (CN); Zhengwei Qian, Langfang (CN); Yin Wang, Langfang (CN); Wei Wang, Langfang (CN); Lele Hu, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 36 days.

(21) Appl. No.: 16/824,079

(22) Filed: Mar. 19, 2020

(65) Prior Publication Data

US 2020/0221590 A1 Jul. 9, 2020

Related U.S. Application Data

(63) Continuation of application No. PCT/CN2019/080415, filed on Mar. 29, 2019.

(30) Foreign Application Priority Data

Sep. 18, 2018 (CN) .......................... 201821526349.9

(51) Int. Cl.
*H05K 5/00* (2006.01)
*H05K 1/14* (2006.01)
*H05K 5/02* (2006.01)

(52) U.S. Cl.
CPC ........... *H05K 5/0017* (2013.01); *H05K 1/147* (2013.01); *H05K 5/0086* (2013.01); *H05K 5/0217* (2013.01); *H05K 2201/10037* (2013.01); *H05K 2201/10128* (2013.01); *H05K 2201/10151* (2013.01)

(58) Field of Classification Search
CPC .... H05K 5/0017; H05K 1/147; H05K 5/0086; H05K 2201/10128; G06F 3/014; G06F 1/163; G06F 1/1652
USPC .......................................... 361/749
See application file for complete search history.

(56) References Cited

U.S. PATENT DOCUMENTS

| 2017/0185105 A1* | 6/2017 | Fan ........................ G06F 1/1652 |
| 2017/0290177 A1* | 10/2017 | Wang ................... H01L 51/5237 |
| 2018/0343330 A1* | 11/2018 | Lin ....................... H04M 1/0268 |

FOREIGN PATENT DOCUMENTS

| CN | 103971603 A | 8/2014 |
| CN | 203786602 U | 8/2014 |
| CN | 205106606 U | 3/2016 |
| CN | 105378581 B | 8/2018 |

(Continued)

OTHER PUBLICATIONS

PCT International Search Report of PCT/CN2019/080415 dated Jul. 2, 2019.

(Continued)

*Primary Examiner* — Sherman Ng
(74) *Attorney, Agent, or Firm* — Ladas & Parry LLP

(57) ABSTRACT

A flexible display device includes: a supporting elastic sheet, configured to be in a flat state and/or a bent state without an influence of an external factor; and a flexible display screen disposed on a side of the supporting elastic sheet. The supporting elastic sheet is configured to support the flexible display screen and drive the flexible display screen to be in a flat state and/or a bent state.

19 Claims, 4 Drawing Sheets

(56) References Cited

FOREIGN PATENT DOCUMENTS

| CN | 108447408 | A | 8/2018 |
|---|---|---|---|
| CN | 208523936 | U | 2/2019 |
| EP | 3179356 | A1 | 6/2017 |
| JP | 2016018198 | A | 2/2016 |

OTHER PUBLICATIONS

PCT Written Opinion of PCT/CN2019/080415 dated Jul. 2, 2019.
English translation of CN208523936.
English translation of CN103971603.
English translation of CN108447408.
English translation of CN203786602.
English translation of JP2016018198.
English translation of CN105378581.
English translation of CN205106606.

* cited by examiner

FLEXIBLE DISPLAY DEVICE

CROSS-REFERENCE TO RELATED APPLICATIONS

The present application is a continuation of International Application No. PCT/CN2019/080415 filed on Mar. 29, 2019, which claims priority of Chinese patent application CN201821526349.9, filed on Sep. 18, 2018. Both applications are incorporated herein by reference in their entireties.

TECHNICAL FIELD

The present application relates to the field of display technology, and more particularly to a flexible display device.

BACKGROUND

With the development of flexible display technology, a wearable flexible display device has become more and more popular due to its characteristics such as portability. Therefore, designing a wearable flexible display device has become an urgent problem to be solved.

SUMMARY

In view of this, the present application provides a flexible display device which is wearable.

One aspect of the present application provides a flexible display device. The flexible display device includes: a supporting elastic sheet, configured to be in a flat state and/or a bent state without an influence of an external factor; and a flexible display screen disposed on a side of the supporting elastic sheet. The supporting elastic sheet is configured to support the flexible display screen and drive the flexible display screen to be in the flat state and/or the bent state.

In an embodiment of the present application, the flexible display device further includes a fixing elastic sheet disposed on a side of the supporting elastic sheet away from the flexible display screen. The fixing elastic sheet is configured to fix the supporting elastic sheet.

In an embodiment of the present application, the fixing elastic sheet includes a first flat area. The fixing elastic sheet is fixed to the supporting elastic sheet at the first flat area.

In an embodiment of the present application, at least one pair of grasping hooks are disposed at opposite edges of the first flat area, and the grasping hooks are configured to fix the supporting elastic sheet.

In an embodiment of the present application, an end of the supporting elastic sheet is fixed to the fixing elastic sheet.

In an embodiment of the present application, the fixing elastic sheet is provided with a convex column, the supporting elastic sheet is provided with a chute, and the supporting elastic sheet and the fixing elastic sheet are fixed together through a cooperation of the chute the convex column.

In an embodiment of the present application, an adhesive layer is disposed on the fixing elastic sheet. An end of the supporting elastic sheet and the fixing elastic sheet are separable fixed by using the adhesive layer.

In an embodiment of the present application, the fixing elastic sheet further includes an opening area, two annular areas and two second flat areas. The first flat area is connected to one of the two second flat areas through one of the two annular areas, the first flat area is connected to the other of the two second flat areas through the other of the two annular areas, the opening area is located between the two second flat areas.

In an embodiment of the present application, the flexible display device further includes a main board disposed on the first flat area, and two sub-batteries disposed on the two second flat areas respectively.

In an embodiment of the present application, the flexible display device further includes a main board and a flexible circuit board disposed on the supporting elastic sheet. The main board and the flexible display screen are electrically connected through the flexible circuit board.

In an embodiment of the present application, the main board includes a plurality of sub-main boards electrically connected to each other.

In an embodiment of the present application, the flexible display device further includes a flexible battery providing power for the flexible display device.

In an embodiment of the present application, the flexible display device further includes a battery providing power for the flexible display device. The battery includes a plurality of sub-batteries electrically connected to each other.

In an embodiment of the present application, the supporting elastic sheet is further configured to be in the flat state and/or a curled state naturally without the influence of the external factor.

In an embodiment of the present application, the flexible display device further includes a bending sensor and a main board. The flexible display device is used for sensing whether the flexible display screen is in the bent state. The bending sensor is electrically connected to the main board.

In an embodiment of the present application, the flexible display device further includes a foam disposed between the supporting elastic sheet and the flexible display screen.

In an embodiment of the present application, the supporting elastic sheet includes a flat area and two bent areas without the influence of the external factor. The flat area of the supporting elastic sheet is located between the two bent areas of the supporting elastic sheet.

In an embodiment of the present application, a size of a display area of the flexible display screen is equivalent to a size of the supporting elastic sheet in an extending direction along a long side of the supporting elastic sheet.

In an embodiment of the present application, the flexible display device further includes a main board and a battery. The main board includes at least one sub-main board electrically connected to each other; and/or the battery includes at least one sub-battery electrically connected to each other.

In an embodiment of the present application, the flexible display device further includes a main board. A voice acquisition and playback module and a translation calculation module are integrated on the main board, and the translation calculation module is electrically connected to the voice acquisition and playback module and the flexible display screen respectively; or a voice acquisition and playback module and a communication module are integrated on the main board, and the communication module is electrically connected to the voice acquisition and playback module and the flexible display screen respectively.

In an embodiment of the present application, the flexible display device further includes a main board and a motion sensor electrically connected to the main board. A calculation unit for identifying motion data of the motion sensor is integrated on the main board.

In an embodiment of the present application, the motion sensor is a six-axis motion sensor.

In embodiments of the present application, the flexible display screen is supported by a supporting elastic sheet, and the supporting elastic sheet may drive the flexible display screen to be in a flat and/or a bent state, so that when an entire display area of the flexible display screen is needed to play by a user, the supporting elastic sheet may be flattened; and when a part of the display area is needed to play by a user, the supporting elastic sheet may be bent and also may be partly flattened and partly bent. So that different application demands are met. At the same time, when the supporting elastic sheet is in the bent state, the flexible display device may be hung on other objects directly, thereby a wearable function is achieved.

DETAILED DESCRIPTION OF THE EMBODIMENTS

A clear and complete description of technical solutions of the embodiments of the present application will be given below, in combination with the accompanying drawings in the embodiments of the present application. Apparently, the embodiments described below are a part, but not all, of the embodiments of the present application. All of other embodiments, obtained by those skilled in the art based on the embodiments of the present application without any inventive efforts, fall into the protection scope of the present application.

Where possible, the same or similar parts mentioned in various parts of the accompanying drawings may use the same reference numbers.

Figure 1:
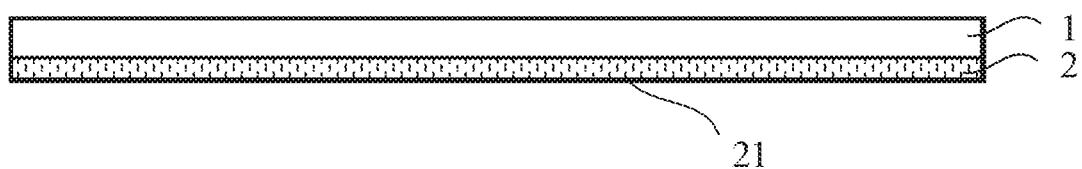
FIG. 1 is a schematic structural diagram of a flexible display device according to an embodiment of the present application.

FIG. 1 is a schematic structural diagram of a flexible display device according to an embodiment of the present application.

As shown in FIG. 1, the flexible display device includes: a supporting elastic sheet 2 configured to be in a flat state and/or a bent state without an influence of an external factor; and a flexible display screen 1 disposed on a side of the supporting elastic sheet 2. The supporting elastic sheet 2 is configured to support the flexible display screen 1 and drive the flexible display screen 1 to be in a flat state and/or a bent state.

Specifically, in order to increase a display area of the flexible display device to facilitate user operations, the flexible display screen 1 may have a high screen-to-body ratio. For example, the flexible display screen 1 may be a full screen. The supporting elastic sheet 2 may be an elastic sheet, which steadies in the bent state under the influence of an external factor and returns to the flat state after removing the external factor. This type of supporting elastic sheet 2 may be named as a first type of supporting elastic sheet 2 for easy description. In addition, the supporting elastic sheet 2 may also be an elastic sheet, which steadies in the flat state without the influence of an external factor, returns to the bent state when an external factor is applied to the supporting elastic sheet 2, and remains the bent state after the applied external factor is removed. When the external factor continues to be applied to the bent supporting elastic sheet 2, a force opposite to the bending direction will be created on the supporting elastic sheet 2, so that the supporting elastic sheet 2 returns to the flat state, and after the external factor is removed, the supporting elastic sheet 2 is still in the flat state. This type of supporting elastic sheet 2 may be named as a second type of supporting elastic sheet 2 for easy description. The type of the supporting elastic sheet 2 is not specifically limited herein.

In an embodiment of the present application, the supporting elastic sheet 2 is naturally in the flat state and in the bent state at the same time without the influence of the external factor. In this case, the supporting elastic sheet 2 may include a flat area and a bent area. The flat area of the supporting elastic sheet 2 may turn to a bent state under the influence of the external factor, and after the external factor is removed, the flat area of the supporting elastic sheet 2 may remain in the bent state or revert to the flat state due to the difference in materials. Similarly, the bent area of the supporting elastic sheet 2 is also like this. However, this type of supporting elastic sheet 2 may belong to both the first type of supporting elastic sheet 2 and the second type of supporting elastic sheet 2 according to the difference in selected materials. This situation should be taken into consideration when referring to the supporting elastic sheet 2 hereinafter.

In an embodiment of the present application, the supporting elastic sheet 2 includes a flat area and two bent areas without an external influence. The flat area of the supporting elastic sheet 2 is located between the two bend areas of the supporting elastic sheet 2.

Specifically, when the flexible display device is used as a wristband, in order to adapt to the shape of the wrist to make it facilitate for wearing the flexible display device, the supporting elastic sheet 2 may include a flat area and two bent areas. The flat area may correspond to the direction of the back of the hand. In order to make it facilitate for viewing the entire display area of the flexible display device, the flexible display device worn on the wrist can be taken off, and the two bent areas of the supporting elastic sheet 2 can be flattened by the external factor, thereby content on the entire display area is facilitate to be view by the user.

In an embodiment of the present application, the supporting elastic sheet 2 may be further configured to be in a flat state and/or a curled state without the influence of the external factor.

Specifically, herein, the bent state of the supporting elastic sheet 2 may include two cases. One case is that the curvature radius of the supporting elastic sheet 2 is large and the degree of bending is small; the other case is that the curvature radius of the supporting elastic sheet 2 is small and the degree of bending is large. If each area of the supporting elastic sheet 2 has a large degree of bending, the supporting elastic sheet 2 is in a curled state, that is, a roll state. At this time, the flexible display screen 1 may be hung on any object by the supporting elastic sheet 2, and it is not easy to fall off.

When the flexible display screen 1 needs to be in a flat state, the external factor can be applied to the supporting elastic sheet 2, so that the carrier elastic sheet 2 is in the flat state. When the flexible display screen 1 needs to be in the flat state and the curled state at the same time, it may be realized that the middle area is in the flat state and the area at both ends is in the curled state, which can adapt to different display screens with different sizes.

It should be understood that the external factor mentioned above may be a factor capable of exerting a force on the supporting elastic sheet 2. For example, the force may be an external force applied manually, or an internal force produced by electrifying the supporting elastic sheet 2. In the case of electrifying the supporting elastic sheet 2, the supporting elastic sheet 2 may be composed of bimetals with different thermal expansion coefficients. When the supporting elastic sheet 2 is electrified, the supporting elastic sheet 2 is deformed due to heat generation, that is, it presents the flat state or the bent state. The type of the external factor is not specifically limited herein.

As for a structure of the supporting elastic sheet 2 and the flexible display screen 1, the supporting elastic sheet 2 may be interconnected with the flexible display screen 1 and configured to support the flexible display screen 1. The deformation of the supporting elastic sheet 2 may drive the deformation of the flexible display screen 1. For example, when the supporting elastic sheet 2 is in the flat state, the flexible display screen 1 is also in the flat state. When the supporting elastic sheet 2 is bent caused by an external factor, the flexible display screen 1 is bent with the bending of the supporting elastic sheet 2. When the supporting elastic sheet 2 is restored from the bent state to the flat state, the flexible display screen 1 is also restored from the bent state to the flat state with the supporting elastic sheet 2. In an embodiment of the present application, in order to prevent the flexible display screen 1 from being damaged by being pulled during a bending process, the flexible display device may further include foam disposed between the supporting elastic sheet 2 and the flexible display screen 1. Specifically, a tensile stress on the flexible display screen 1 may be alleviated by the foam during the bending process. Two opposite surfaces of the foam may be provided with glue for bonding the supporting elastic sheet 2 and the flexible display screen 1.

Herein, in an extending direction along a short side of the supporting elastic sheet 2, a width of the supporting elastic sheet 2 may be smaller than a width of the flexible display screen 1, or the width of the supporting elastic sheet 2 may be larger than the width of the flexible display screen 1, or the width of the supporting elastic sheet 2 may be equal to the width of the flexible display screen 1. The relationship between the width of the supporting elastic sheet 2 and the width of the flexible display screen 1 is not limited herein.

In the embodiment of the present application, the flexible display screen 1 is carried by the supporting elastic sheet 2, and the supporting elastic sheet 2 may drive the flexible display screen 1 to present in a flat state and/or bent state. So that when a user needs to view the entire display area of the flexible display screen 1, the supporting elastic sheet 2 may be in the flat state; when the user only needs to view a part of the display area, the supporting elastic sheet 2 may be in the bent state, thereby different application demand are satisfied. At the same time, when the supporting elastic sheet 2 is in the bent state, the flexible display device may be hung on other objects directly, thereby a wearable function is achieved.

Figure 2:
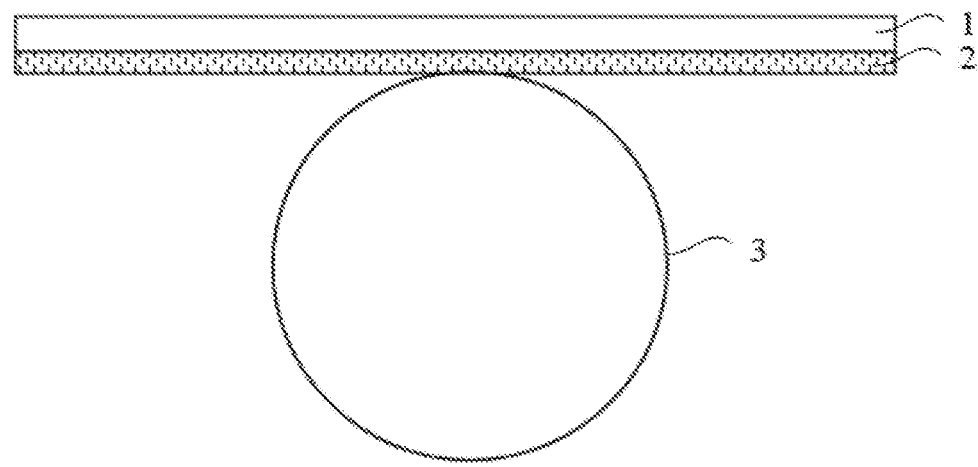
FIG. 2 is a schematic structural diagram of a flexible display device according to another embodiment of the present application.

FIG. 2 is a schematic structural diagram of a flexible display device according to another embodiment of the present application.

In an embodiment of the present application, the flexible display device may further include a fixing elastic sheet 3 disposed on a side of the supporting elastic sheet 2 away from the flexible display screen 1. The fixing elastic sheet 3 is configured to fix the supporting elastic sheet 2.

Specifically, as shown in FIG. 2, the flexible display device further includes a fixing elastic sheet 3, so that when only partial display area of the flexible display screen 1 is needed for display, the supporting elastic sheet 2 may be bent along the shape of the fixing elastic sheet 3, so that, the flexible display screen 1 is in the bent state. When the entire display area of the flexible display screen 1 is needed for display, the fixing elastic sheet 3 may play a fixing and supporting role on the supporting elastic sheet 2, so that, the flexible display screen 1 is in the flat state. Herein, the shape of the fixing elastic sheet 3 may be a shape designed for easy wearing on a wrist, or a shape designed for easy wearing on an arm, or a shape designed for easy hanging on other objects (such as a school bag, and the like), and the shape of the fixing elastic sheet 3 is not specifically limited herein.

Figure 3:
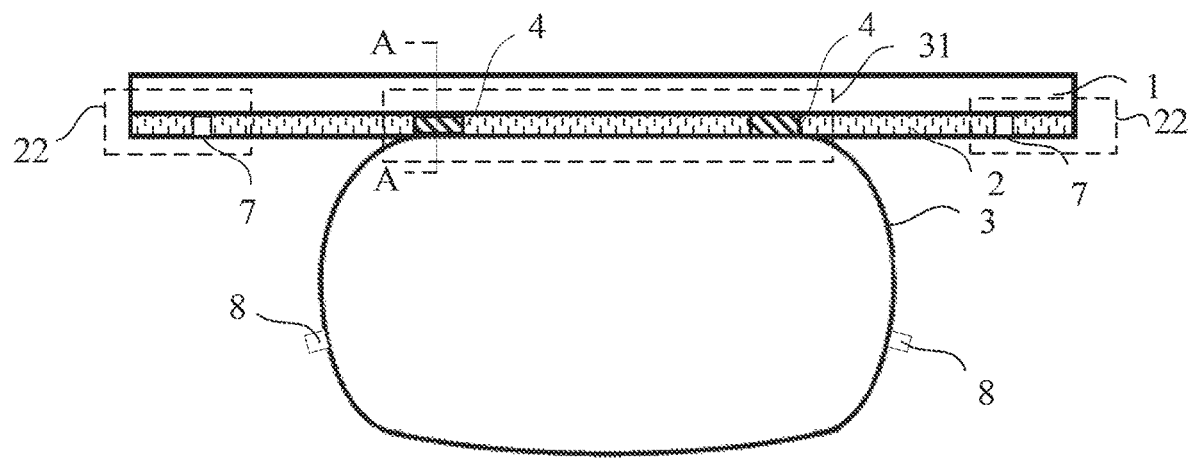
FIG. 3 is a schematic structural diagram of a flexible display device according to another embodiment of the present application.

FIG. 3 is a schematic structural diagram of a flexible display device according to another embodiment of the present application.

In an embodiment of the present application, the fixing elastic sheet 3 may include a first flat area 31. The fixing elastic sheet 3 and the supporting elastic sheet 2 are separable fixed by using the first flat area 31.

Specifically, as shown in FIG. 3, when a shape of the fixing elastic sheet 3 is annular, in order to make it facilitate to fix the fixing elastic sheet 3 and the supporting elastic sheet 2, the fixing elastic sheet 3 may include a first flat area 31. Herein, the first flat area 31 may be an area in a flat state of the fixing elastic sheet 3. Similarly, a second flat area 32 and an annular area 33 described below are also the same. The fixation between the fixing elastic sheet 3 and the supporting elastic sheet 2 may be an adhesive fixing, such as welding, adhesive bonding, and the like, or a mechanical fixing. The fixation between the fixing elastic sheet 3 and the supporting elastic sheet 2 is not specifically limited herein.

It should be understood that, when the supporting elastic sheet 2 includes a flat area, the position of the flat area of the supporting elastic sheet 2 may correspond to the position of the first flat area 31 of the fixing elastic sheet 3.

Figure 4:
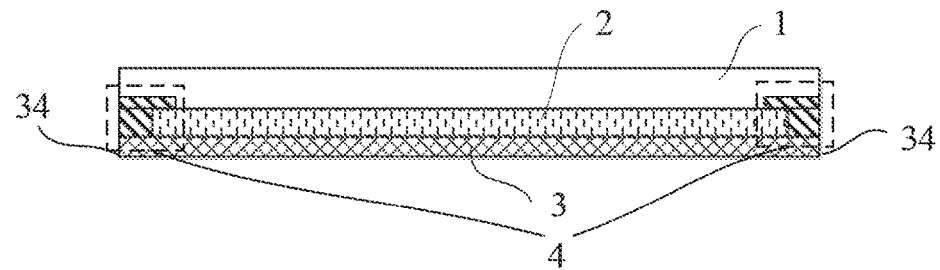
FIG. 4 is a schematic diagram of a sectional view at A-A position in FIG. 3.

FIG. 4 is a schematic diagram of a sectional view at A-A position in FIG. 3.

In an embodiment of the present application, at least one pair of grasping hooks 4 is provided at two long sides 34 of the fixing elastic sheet 3 corresponding to the first flat area 31. The at least one pair of grasping hooks are used to fix the supporting elastic sheet 2.

Specifically, as shown in FIG. 3 and FIG. 4, the fixing elastic sheet 3 may be in a strip shape. The supporting elastic sheet 2 is fixed to the fixing elastic sheet 3 by using the grasping hooks 4. The number of pairs of the grasping hooks 4 may be preferably two, and the grasping hooks 4 may be adjacent to the annular area 33 of the fixing elastic sheet 3 respectively, so as to ensure that the first flat area 31 is in the flat state.

In an embodiment of the present application, an end 22 of the supporting elastic sheet 2 and the fixing elastic sheet 3 can be separated from each other or be fixed together.

Specifically, the supporting elastic sheet 2 may be in a strip shape, and the end 22 of the supporting elastic sheet 2 may refer to an end of an extending direction along the long side 21 (as shown in FIG. 1) of the supporting elastic sheet 2. When a large display area is not required, that is, a partial display area can meet application demands, in order to protect the flexible display screen 1, the end 22 extending along the long side 21 of the supporting elastic sheet 2 may be fixed to the fixing elastic sheet 3, so that the supporting elastic sheet 2 is in a bent state. When the entire display area is required, the end 22 extending along the long side 21 of the supporting elastic sheet 2 may be separated from or be fixed with elastic sheet 3, so that the supporting elastic sheet 2 is in a flat state to facilitate the users to view display results.

In an embodiment of the present application, the fixing elastic sheet 3 is provided with a convex column 8. The end 22 of the supporting elastic sheet 2 is provided with a chute 7. The end 22 of the supporting elastic sheet 2 and the fixing elastic sheet 3 may be separable fixed by using the cooperation of the chute 7 and the convex column 8.

Specifically, the chute 7 and the short side of the supporting elastic sheet 2 are adjacent or spaced apart. The connection between the chute 7 and the short side of the supporting elastic sheet 2 is not limited herein. In the second type of supporting elastic sheet 2, the supporting elastic sheet 2 may be fixed to the fixing elastic sheet 3 without a fixing structure. However, in the first type of supporting elastic sheet 2, a fixing structure is required, otherwise the supporting elastic sheet 2 cannot be in a bent state. Specifically, the convex column 8 may be inserted into a corresponding chute 7 so as to achieve the fixation between the end 22 of the supporting elastic sheet 2 and the fixing elastic sheet 3. When the convex column 8 is pulled out from the chute 7, the end 22 of the supporting elastic sheet 2 and the fixing elastic sheet 3 are separated.

It should be understood that the chute 7 may also be provided on the fixing elastic sheet 3 and the convex column 8 is provided on the end 22 of the supporting elastic sheet 2. The positions of the chute 7 and the convex column 8 are not limited herein.

In an embodiment of the present application, an adhesive layer is provided on the fixing elastic sheet 3, and the end 22 of the supporting elastic sheet 2 and the fixing elastic sheet 3 can be separated from each other or be fixed together by the adhesive layer.

Specifically, for the first type of supporting elastic sheet 2, the end 22 of the supporting elastic sheet 2 and the fixing elastic sheet 3 may also be separated from each other or be fixed together by the adhesive layer. For example, the adhesive layer may be silica gel with adhesive on the back, and the adhesive layer may also be a magic adhesive. Two parts of the magic adhesive may be located on the supporting elastic sheet 2 and the fixing elastic sheet 3 respectively.

Similarly, the end 22 of the supporting elastic sheet 2 and the fixing elastic sheet 3 may also be separated from each other or be fixed together by the adsorption of a magnet.

Figure 5:
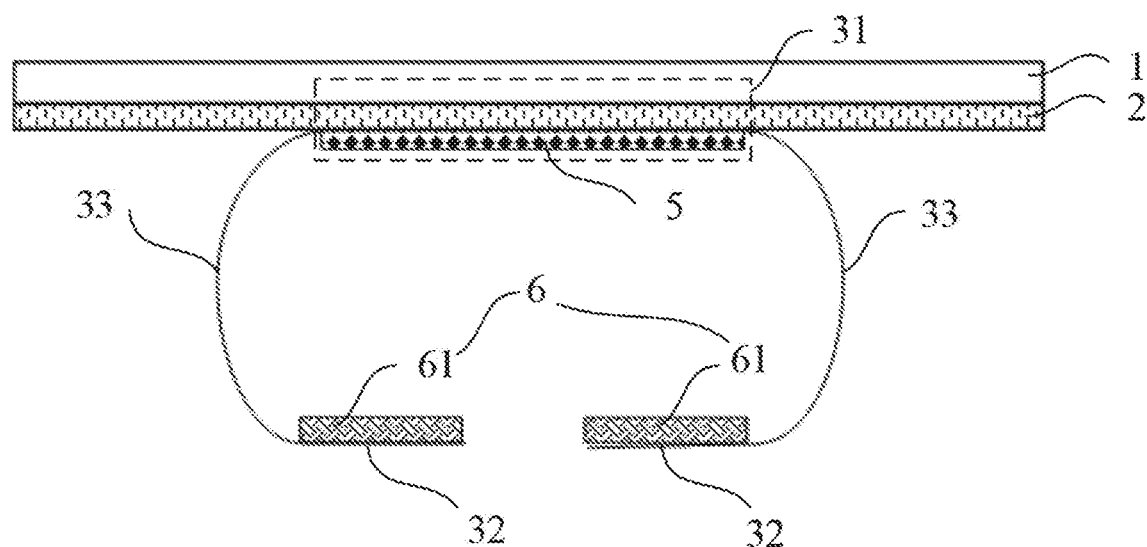
FIG. 5 is a schematic structural diagram of a flexible display device according to another embodiment of the present application.

FIG. 5 is a schematic structural diagram of a flexible display device according to another embodiment of the present application.

In an embodiment of the present application, the fixing elastic sheet 3 may further include an opening area, two annular areas 33 and two second flat areas 32. The first flat area 31 is connected to one of the two second flat areas 32 through one of the two annular areas 33, and the first flat area 31 is also connected to the other of the two second flat areas 32 through the other of the two annular areas 33. The opening area is located between the two second flat areas 32.

Specifically, as shown in FIG. 5, the fixing elastic sheet 3 may include a first flat area 31, a second flat area 32, an annular area 33 and an opening area. The setting of the opening area may make the fixing elastic sheet 3 have a large elastic movement space, thereby the flexible display device is convenient to wear. The first flat area 31 may be used for fixing the supporting elastic sheet 2, and at the same time, the first flat area 31 and the second flat area 32 may be used together for setting a non-flexible part or a less flexible part of the flexible display device, for example, a main board 5, a battery 6 and so on. As shown in FIG. 5, the main board 5 of the flexible display device is set on the first flat area 31, and two sub-batteries 61 of the flexible display device are respectively set on the two second flat areas 32.

It should be understood that if components such as the main board 5, the battery 6, and the like are flexible, and the degree of bending of the fixing elastic sheet 3 is not large, the placement positions of the components such as the main board 5, the battery 6, and the like may not be limited. The shape of the fixing elastic sheet 3 is not limited.

Figure 6:
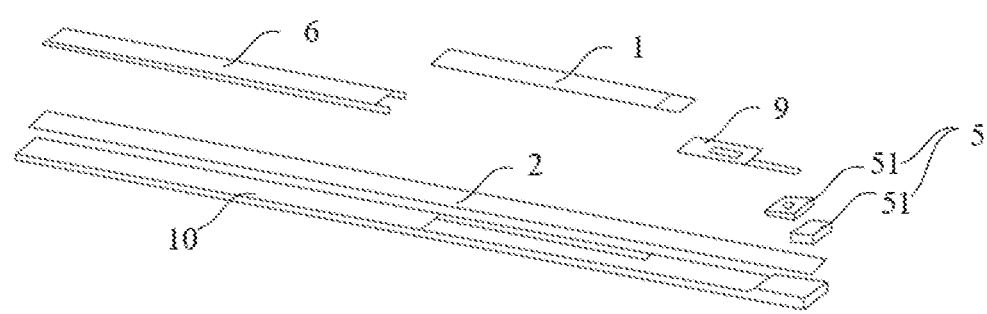
FIG. 6 is a schematic structural diagram of a flexible display device according to another embodiment of the present application.

FIG. 6 is a schematic structural diagram of a flexible display device according to another embodiment of the present application.

When there is not the fixing elastic sheet 3 in the flexible display device, the supporting elastic sheet 2 is preferably a second type of supporting elastic sheet 2. Specifically, as shown in FIG. 6, in addition to the flexible display screen 1, a main board 5, a flexible battery 6 and a Flexible Printed Circuit (FPC) 9 may also be set on the supporting elastic sheet 2. The FPC circuit 9 can be used for electrically connecting the flexible display screen 1 and the main board 5, and the flexible battery 6 can power the flexible display device. In order to make it facilitate for the bending of the flexible display device, the main board 5 may include two sub-main boards 51 electrically connected to each other. In addition, the flexible display device may further include a flexible casing 10 for wrapping the supporting elastic sheet 2, the main board 5, the flexible battery 6, the FPC circuit 9, and the like, thereby these components are protected.

In an embodiment of the present application, in order to make it facilitate for the bending of the flexible display device and also make the position of the main board 5 unrestricted, the main board 5 may include a plurality of sub-main boards 51 electrically connected to each other.

Similarly, in an embodiment of the present application, in order to make it facilitate for the bending of the flexible display device, and also make the position of the battery 6 unrestricted, the battery 6 may include a plurality of sub-batteries 61 electrically connected to each other.

Figure 7:
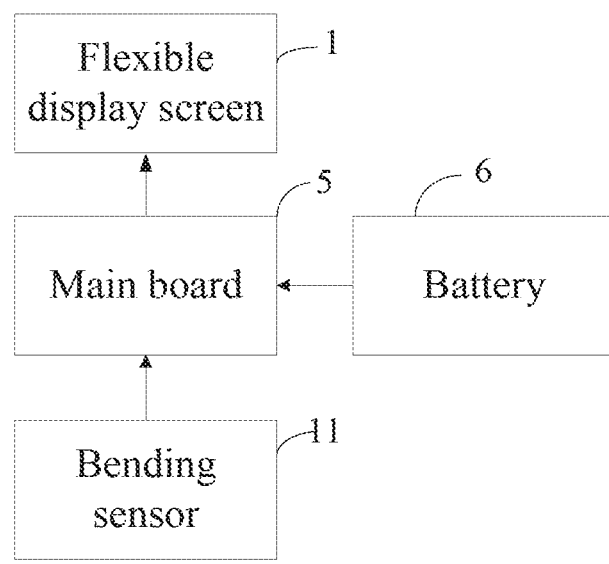
FIG. 7 is a schematic circuit diagram of a flexible display device according to an embodiment of the present application.

FIG. 7 is a schematic circuit diagram of a flexible display device according to an embodiment of the present application.

Specifically, as shown in FIG. 7, the main board 5 may be electrically connected to the flexible display screen 1 through a cable to provide power and data signals to the flexible display screen 1. The battery 6 may power the main board 5 through a flat cable. In an embodiment of the present application, the flexible display device may further include a bending sensor 11 for sensing whether the flexible display screen 1 is in the bent state. Specifically, the bending sensor may be electrically connected to the main board 5 through an FPC circuit, so that when the bending sensor senses that the flexible display screen 1 is in the bent state, the main board 5 performs a corresponding operation on the flexible display screen 1.

The material of the fixing elastic sheet 3 and the supporting elastic sheet 2 may be elastic metal, such as elastic steel.

In an embodiment of the present application, in an extending direction along a long side 21 of the supporting elastic sheet 2, the size of a display area of the flexible display screen 1 may be equivalent to that of the supporting elastic sheet 2.

Specifically, in the extending direction along the long side 21 of the supporting elastic sheet 2, in order to increase the display area to make it facilitate for user operations, the size of the display area of the flexible display screen 1 is equivalent to the size of the supporting elastic sheet 2. At this time, most functions of a mobile phone can be completed on the flexible display screen 1, thereby user operation effect is effectively improved, and user experience is raised further.

Herein, the size of the display area of the flexible display screen 1 is equivalent to the size of the supporting elastic sheet 2. It may mean that the size of the display area of the flexible display screen 1 is equal to the size of the supporting elastic sheet 2, or the size of the display area of the flexible display screen 1 is slightly smaller than the size of the supporting elastic sheet 2, or the size of the display area of the flexible display screen 1 is slightly larger than the size of the supporting elastic sheet 2.

In an embodiment of the present application, the flexible display device further includes a main board 5. A voice acquisition and playback module and a translation calculation module are integrated on the main board 5, and the translation calculation module is electrically connected to the voice acquisition and playback module and the flexible display screen 1 respectively; or a voice acquisition and playback module and a communication module are integrated on the main board 5, and the communication module is electrically connected to the voice acquisition and playback module and the flexible display screen 1 respectively.

Specifically, the flexible display device may be used to translate and display a translation result. Herein, the voice acquisition and playback module may be used to collect voice to be translated and play translated voice. Specifically, a microphone or a microphone array may be integrated on the main board 5 to collect the voice to be translated. Accordingly, the translated voice may be played through a speaker. For the collected voice to be translated, the flexible display device may perform translation functions by calling the translation calculation module on the main board 5, and transfer the voice to be translated to other devices, such as a mobile phone, and the like, through the communication module, so as to reduce the calculation complexity and power consumption of the flexible display device. Specifically, the transmission mode adopted by the communication module may be wired or wireless, such as Bluetooth, WIFI, and the like, and the transmission mode adopted by the communication module is not specifically limited herein.

In an embodiment of the present application, the flexible display device further includes a main board 5 and a motion sensor electrically connected to the main board 5. A calculation unit for identifying motion data of the motion sensor is integrated on the main board 5.

Specifically, the flexible display device may control the flexible display screen 1 through the motion sensor, so as to form an interactive supplement with a manner of operating the flexible display screen 1. For example, the motion sensor may be a six-axis motion sensor. The flexible display device may be worn on user s wrist, and the flexible display screen 1 may be controlled by rotating with the elbow joint as a fulcrum. For example, when the arm rotates one turn clockwise, the flexible display device may repeat the translation of a previous sentence, and when the arm continue to rotate one more turn, the flexible display device may repeat the translation of a sentence before the previous sentence. When the arm rotates one turn counterclockwise, the flexible display device may repeat the translation of a next sentence. Herein, an acceleration sensor in the six-axis motion sensor may sense the movement process, and a gyro sensor in the six-axis motion sensor may sense the direction of the movement, which is then synthesized to sense clockwise rotation or counterclockwise rotation.

It should be understood that signals transmitted by the motion sensor may also be defined as other interactive meanings as appropriate, and the meaning of the signals transmitted by the motion sensor is not specifically limited herein.

The above are only the preferred embodiments of the present application and are not configured to limit the scope of the present application. Any modifications, equivalent substitutions, improvement and so on made within the spirit and principle of the present application should be included within the scope of the present application.

What is claimed is:

1. A flexible display device, comprising: a supporting elastic sheet, configured to be in a flat state and/or a bent state without an influence of an external factor; a flexible display screen disposed on a side of the supporting elastic sheet; wherein the supporting elastic sheet is configured to support the flexible display screen and drive the flexible display screen to be in the flat state and/or the bent state; and a fixing elastic sheet disposed on a side of the supporting elastic sheet away from the flexible display screen; wherein the fixing elastic sheet is configured to fix the supporting elastic sheet.

2. The flexible display device according to claim 1, wherein the fixing elastic sheet comprises a first flat area; wherein the fixing elastic sheet is fixed to the supporting elastic sheet at the first flat area.

3. The flexible display device according to claim 2, wherein at least one pair of grasping hooks are disposed at opposite edges of the first flat area, and the grasping hooks are configured to fix the supporting elastic sheet.

4. The flexible display device according to claim 1, wherein an end of the supporting elastic sheet is fixed to the fixing elastic sheet.

5. The flexible display device according to claim 4, wherein the fixing elastic sheet is provided with a convex column, the supporting elastic sheet is provided with a chute, the supporting elastic sheet and the fixing elastic sheet are fixed together through a cooperation of the chute and the convex column.

6. The flexible display device according to claim 2, wherein the fixing elastic sheet further comprises an opening area, two annular areas and two second flat areas; wherein the first flat area is connected to one of the two second flat areas through one of the two annular areas, the first flat area is connected to the other of the two second flat areas through the other of the two annular areas, the opening area is located between the two second flat areas.

7. The flexible display device according to claim 6, further comprising a main board disposed on the first flat area and two sub-batteries disposed on the two second flat areas respectively.

8. The flexible display device according to claim 1, further comprising a main board and a flexible circuit board disposed on the supporting elastic sheet; wherein the main board and the flexible display screen are electrically connected through the flexible circuit board.

9. The flexible display device according to claim 8, wherein the main board comprises a plurality of sub-main boards electrically connected to each other.

10. The flexible display device according to claim 8, further comprising a flexible battery providing power for the flexible display device.

11. The flexible display device according to claim 8, further comprising a battery providing power for the flexible display device; wherein the battery comprises a plurality of sub-batteries electrically connected to each other.

12. The flexible display device according to claim 1, wherein the supporting elastic sheet is further configured to be in the flat state and/or a curled state without the influence of the external factor.

13. The flexible display device according to claim 1, further comprising a bending sensor and a main board; wherein the bending sensor is used for sensing whether the flexible display screen is in the bent state, the bending sensor is electrically connected to the main board.

14. The flexible display device according to claim 1, further comprising a foam disposed between the supporting elastic sheet and the flexible display screen.

15. The flexible display device according to claim 1, wherein the supporting elastic sheet comprises a flat area and two bent areas without the influence of the external factor; wherein the flat area of the supporting elastic sheet is located between the two bent areas of the supporting elastic sheet.

16. The flexible display device according to claim 1, wherein a size of a display area of the flexible display screen is equivalent to a size of the supporting elastic sheet in an extending direction along a long side of the supporting elastic sheet.

17. The flexible display device according to claim 1, further comprising a main board; wherein a voice acquisition and playback module and a translation calculation module are integrated on the main board, and the translation calculation module is electrically connected to the voice acquisition and playback module and the flexible display screen respectively; or a voice acquisition and playback module and a communication module are integrated on the main board, and the communication module is electrically connected to the voice acquisition and playback module and the flexible display screen respectively.

18. The flexible display device according to claim 1, further comprising a main board and a motion sensor electrically connected to the main board; wherein a calculation unit for identifying motion data of the motion sensor is integrated on the main board.

19. The flexible display device according to claim 18, wherein the motion sensor is a six-axis motion sensor.

* * * * *